Oct. 5, 1965 F. V. WILLIAMS 3,210,624

ARTICLE HAVING A SILICON CARBIDE SUBSTRATE WITH AN EPITAXIAL LAYER OF BORON PHOSPHIDE

Filed April 24, 1961 2 Sheets-Sheet 1

INVENTOR.
FORREST V. WILLIAMS
BY William J. Andress

ATTORNEY / AGENT

Oct. 5, 1965 F. V. WILLIAMS 3,210,624
ARTICLE HAVING A SILICON CARBIDE SUBSTRATE WITH AN EPITAXIAL LAYER OF BORON PHOSPHIDE
Filed April 24, 1961 2 Sheets-Sheet 2

INVENTOR.
FORREST V. WILLIAMS
BY William J. Andreas
ATTORNEY / AGENT

United States Patent Office 3,210,624
Patented Oct. 5, 1965

3,210,624

ARTICLE HAVING A SILICON CARBIDE SUBSTRATE WITH AN EPITAXIAL LAYER OF BORON PHOSPHIDE

Forrest V. Williams, Dayton, Ohio, assignor to Monsanto Company, a corporation of Delaware Filed Apr. 24, 1961, Ser. No. 105,123
11 Claims. (Cl. 317—237)

The present invention relates to a new article of manufacture comprising epitaxial films of single crystal boron phosphide on substrates of silicon carbide and a process for the preparation thereof.

It is an object of this invention to provide a process for producing articles of manufacture suitable for use in various electronic devices.

It is a further object of this invention to provide a method of producing epitaxial film deposits of boron phosphide having controlled electrical properties on silicon carbide substrates also having controlled electrical properties.

A still further object of this invention is the provision of semiconductor devices utilizing the new article of manufacture as the semiconducting component thereof.

Further objects and advantages of this invention will become apparent as the description proceeds.

In FIGURES 1–8 are shown various semiconductor devices and voltage-current graphs in accordance with the instant invention.

Figure 1:
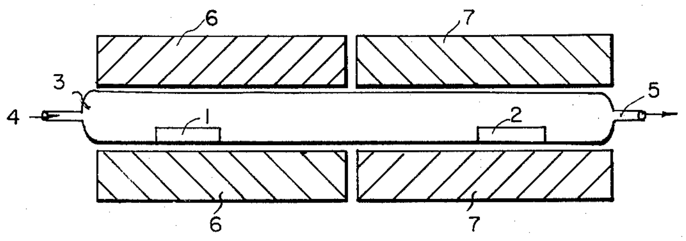
FIGURE 1 is a drawing of a typical apparatus used in the vapor deposition of epitaxial films.

The present process for the production of epitaxial films of a single crystal form of boron phosphide on silicon carbide substrates is based upon a chemical reaction which occurs when crude boron phosphide is volatilized in the presence of a hydrogen halide vapor. The hydrogen halides which are contemplated in the present invention include the group of hydrogen chloride, hydrogen bromide and hydrogen iodide; the preferred member being hydrogen chloride.

The crude boron phosphide which is employed as the source material in the present process may be of any desired purity. For example, in the preparation of an electronic grade of boron phosphide in which very large single crystals are desired, a relatively pure form of boron phosphide is desirably employed as the starting material. However, amorphous boron phosphide and other crude sources are also applicable in the present invention. The hydrogen halide gas may be used from a normal commercial supply as from a cylinder or may be prepared by conventional chemical means.

In the present method the hydrogen halide is a critical reactant and may not be omitted. For example, if boron phosphide is heated by itself or in the presence of an inert gas or hydrogen, there is no distillation or sublimation, but a dissociation into the component elements. However, when, as in the instant invention, boron phosphide is heated in the presence of a hydrogen halide at temperatures within the range of from 500–1500° C., a chemical reaction occurs which from equilibrium data and analyses is as follows:

$$BP_{(s)} + 3HCl_{(g)} \underset{800°\text{–}1800°\ C.}{\overset{500°\text{–}1500°\ C.}{\rightleftharpoons}} BCl_{3(g)} + \tfrac{1}{4}P_{4(g)} + \tfrac{3}{2}H_{2(g)}$$

The reaction mixture is then conducted to a still higher temperature zone where a second reaction, the reverse reaction shown in the equation, occurs and boron phosphide is deposited in a very pure state and in single crystal form, upon a seed crystal of silicon carbide placed in the second zone. The deposited boron phosphide forms an epitaxial layer on the silicon carbide.

The characteristic feature of epitaxial film formation is that starting with a given seed crystal as substrate material, here silicon carbide, having a certain lattice structure and any orientation, a film, layer or overgrowth of the same or different material, here boron phosphide, may be vapor deposited upon the substrate with the deposit assuming the same lattice structure and geometric configuration of the substrate. Of the various silicon carbide crystal modifications known, the cubic crystalline modification is the type used herein, since its lattice parameter constant, $A_0$, being 4.348 is close to that of boron phosphide, 4.537.

The contacting and vapor phase precipitation may be carried out in either a closed system which is completely sealed off after the introduction of the hydrogen halide gas with the boron phosphide, or by use of a continuous gas flow system. The pressure which is obtained in a single-vessel, closed system corresponds to the pressure exerted by the added hydrogen chloride or other hydrogen halide vapor at the operating temperature. When employing a continuous flow system, the hydrogen halide gas is advantageously introduced at the rate of from 1 to 1000 ml./min. However, the rate of flow may vary over wide ranges depending upon the geometry of the system and the thickness of the epitaxial layer desired. The pressure which is maintained in the system may be varied over a considerable range such as from 0.01 to two or more atmospheres, a preferred range being from 0.5 to 1 atmosphere.

The apparatus employed in carrying out the process of the present invention may be any of a number of types. The simplest type constitutes a closed tube of a refractory material such as glass, quartz or a ceramic tube such as mullite into which the crude reactant material is introduced together with the hydrogen halide vapor. The tube is then sealed off and subjected to temperatures within the range of from 500° to 1500° C. preferably from 700–1200° C. in the first temperature zone containing the boron phosphide for a period of from less than one minute to one hour or more, until the reaction is complete. After the tube has thus been heated, the reaction mixture is then passed through a region of still higher temperatures within the range of from 800° C. to 1800° C. and preferably from 1100° C.–1500° C. It is essential in the preferred embodiment that a temperature differential be maintained between the respective temperature zones, such temperature differential being from 50 to 1000° C., while a preferred increment is from 200–500° C.

When the gaseous reaction mixture passes from the first temperature zone to the second and higher temperature zone the above reverse reaction takes place and the single crystal form of the starting material precipitates from the vapor phase in very pure single crystal form and deposits on the silicon carbide seed crystal forming an epitaxial layer therewith.

It is within the scope of this invention, although a less preferred embodiment, to employ a single reaction zone wherein the crude material is first heated to reaction temperatures within the range of 500° C. to 1500° C. in the presence of the hydrogen halide, according to the above equation to obtain the complex mixture, and then raising the reaction zone temperatures to within the higher range defined above, i.e., between 800° C. to 1800° C. to effect a reconversion of the crude starting material to a purified single crystal form of the same material. This procedure is less preferred because it does not produce as large a yield of purified product from the same quantity of crude material and in the same amount of time as the two-zone system.

Various other modifications including horizontal and vertical tubes are contemplated, as well as recycle systems in which the exit gas after precipitation of the single crystal product is returned to the system.

On a larger scale, the present process is operated as a continuous flow system. This may constitute a simple tube in which the solid crude boron phosphide is located and over which source material the hydrogen halide gas is then passed. At the lower temperatures set forth above, the gas stream passes along the same or an additional conduit to another region maintained at a higher temperature. For example, a silica tube located in a multiple zone electric heating furnace may thus be employed to produce the desired first zone temperature followed by a higher temperature in which the precipitation from the vapor phase takes place to yield the single crystal form epitaxial film.

In producing the boron phosphide epitaxial films on silicon carbide substrates, it is frequently desirable to "dope" either the boron phosphide or the silicon carbide, or both, in order to produce "surface junctions," i.e., p-n, or n-p junctions between the substrate and the epitaxial layer. The electrical properties of the substrate and/or the epitaxial layer may be fixed or altered as desired by incorporating therein the desired amount and kind of "impurity." In order to obtain vapor deposits of boron phosphide having the desired conductivity type and resistance, trace amounts of the impurity are incorporated into the crude source of starting boron phosphide. For example, to obtain p-type conductivity, an element selected from Group II of the periodic system, e.g., beryllium, magnesium, zinc, cadmium and mercury is incorporated in the starting boron phosphide. To obtain n-type conductivity, tin or an element selected from Group VI, e.g., sulfur, selenium, or tellurium is incorporated into the starting material. These impurities are carried over with the boron phosphide in the vapor phase into the high temperature zone of the reaction tube and deposited with the boron phosphide as a uniform dispersion in the epitaxial layer formed. Since some of the dopant may be lost during the transportation and deposition of the boron phosphide, an excess amount of the impurity is added to the boron phosphide source material. The excess quantity added is such as to provide the carrier concentration desired in the epitaxial films to be formed.

The silicon carbide substrate may be doped with Group III elements, e.g., boron, aluminum, gallium and indium to produce p-type conductivity, and with Group V elements such as phosphorus, arsenic, antimony and bismuth which produces n-type conductivity.

The silicon carbide substrate may be doped by conventional means known to the art. For example, the doping agent may be introduced in elemental form or as a volatile compound of the dopant element during preparation of the silicon carbide by reacting a compound of silicon, e.g., $SiCl_4$ or $SiHCl_3$ with methane and hydrogen at 1000–1500° C. Also, the dopant may be added by diffusion at elevated temperatures directly into a crystal of silicon carbide, or by adding the dopant to a melt of silicon carbide during crystal growth.

The doping element may be introduced into the epitaxial layer in any manner known in the art, e.g., by chemical combination with or physical dispersion in the starting material.

Vapor deposits of the purified boron phosphide having the same conductivity type as the substrate may be utilized to form intrinsic $pp^+$ or $nn^+$ regions.

The most important aspect of the instant invention is the provision of epitaxial films of boron phosphide on substrates of silicon carbide. Boron phosphide is known for its hardness and high thermal stability. Its hardness lies above 9 on Mohs' scale (diamond=10), and is resistant to oxidation at temperatures in excess of 2100° C. Silicon carbide is likewise a vary hard material having even higher thermal stability. Therefore, in addition to possessing semiconductor properties, these materials as combined herein produce a unique composition of matter for semiconductor devices, particularly those used at higher temperatures.

The product resulting from the instant process has particular utility in the fabrication of semiconductor devices. Heretofore, it has not been known to use silicon carbide substrates having epitaxial layers of boron phosphide in this or any other utility. The instant product is entirely novel. Various electronic devices to which this new composition of matter are applicable as the semiconducting component include tunnel diodes, transistors, solar cells, rectifiers, thermogenerators, detectors optical filters, etc.

While the above product is essentially a silicon carbide substrates having a thin epitaxial layer of boron phosphide, the epitaxial layer may be grown to such thickness as to produce a product having essentially a thin silicon carbide substrate and a thick boron phosphide layer.

The electrical characteristics of the product described above are not entirely the same as those of a substrate of boron phosphide having an epitaxial layer of silicon carbide deposited thereon, although this product is also contemplated herein. The latter product is produced by a vapor phase reaction (similar to that described above for depositing boron phosphide) of silicon tetrahalide or other halide, such as $SiHCl_3$, and methane in the presence of hydrogen. Here, silicon carbide precipitates from the vapor phase as an epitaxial layer on a seed crystal of boron phosphide.

Also contemplated herein are products having a plurality of layers of epitaxial films, each having its own electrical conductivity type and resistivity as controlled and determined by layer thickness and dopant concentration as described below. In this embodiment successive layers of epitaxial films are deposited one upon the other using starting materials, dopants and/or reaction conditions differing from those used in depositing the preceding layer. This procedure permits the deposition of any number of epitaxial layers of boron phosphide, each layer having different electrical properties. In this manner, products having a plurality of p-n junctions may be produced for use in electronic devices requiring a multiplicity of such junctions.

The epitaxial films formed according to this invention may be controlled as to thickness as well as to electrical properties. The thickness of the film may be controlled as desired by regulation of the temperatures within the first and second temperature zones, hydrogen halide flow rates and time of reaction. In general, the formation of large single crystals and thicker layers is favored by higer reaction temperatures and lower hydrogen halide pressures and flow rates.

When thinner films are desired, the reaction time may be shortened by increasing the temperature differentials between the temperature zones and/or increasing the hydrogen halide pressure or flow rate, as the case may be, in closed or open systems.

The invention will be more fully understood with reference to the following specific embodiments:

*Example 1*

This example illustrates the formation and deposition of an epitaxial film of p-type boron phosphide on an n-type silicon carbide substrate.

A sample of polycrystalline boron phosphide is placed in a quartz boat contained in a quartz reaction tube placed approximately in the center of one of the furnaces. The boron phosphide sample is doped to a carrier concentration of $1.2\times10^{20}$ atoms/cc. of zinc.

A polished seed crystal of silicon carbide weighing 2.90 g. and containing $5.5\times10^{18}$ carriers/cc. of phosphorus dispersed therein is placed in the reaction tube at a point near the center of the second furnace.

The furnace surrounding the boron phosphide sample is then heated to 900° C. and the second furnace is heated to 1200° C. while dry hydrogen chloride gas is passed through the reaction tube at a rate of about 2 ml./min. The boron phosphide reacts with the HCl, as described earlier, in the first section of the tube and passes into the second section of the tube maintained at a higher temperature. In this latter section, boron phosphide containing zinc is reformed from the reaction mixture and precipitates from the vapor phase onto the silicon carbide seed crystal. The seed crystal, after 6 hours operation, shows a weight increase of 0.61 g.

X-ray diffraction patterns of the product show that the deposited boron phosphide epitaxial layer is single crystal in form and oriented in the same fashion as the silicon carbide substrate.

Point rectification tests show that a p-n junction exists at the region of the boundary between the p-type boron phosphide layer and the n-type silicon carbide substrates. The zinc dopant has a calculated density of about $1.5\times10^{18}$ atoms/cc.

*Example 2*

This example illustrates the preparation of an n-type boron phosphide epitaxial layer on a p-type silicon carbide substrate.

The procedure described in Example 1 is repeated, but the boron phosphide is doped with about $1\times10^{20}$ carriers/cc. of selenium and the silicon carbide is doped to about $5.8\times10^{19}$ carriers/cc. of gallium. Hydrogen bromide is substituted for HCl and the operation repeated.

The product from this run also shows the formation of an epitaxial layer of boron phosphide having the same crystal orientation as the silicon carbide substrate. This crystal having an n-type conductivity boron phosphide layer ($1\times10^{19}$ carriers/cc. of selenium dispersed therein) and a p-type substrate of silicon carbide, also exhibits rectification showing the existance of a p-n junction at the boundary of epitaxial layer and the seed crystal substrate.

*Example 3*

This example illustrates a procedure for producing a product having a plurality of epitaxial layers of different electrical properties.

The procedure described in Example 1 is repeated step for step to obtain the same product, i.e., a p-type boron phosphide epitaxial layer containing zinc dispersed therein on an n-type silicon carbide seed crystal substrate.

The process is then repeated using a fresh source of boron phosphide which is now doped with an n-type dopant, viz., $1.2\times10^{19}$ carriers/cc. of tellurium. After about 7 hours operation the product is then removed and examined. It is found that a second epitaxial layer of boron phosphide of n-type conductivity is deposited on the p-type layer of boron phosphide, having identical crystal orientation.

By this method any number of epitaxial layers of boron phosphide may be vapor deposited on silicon carbide substrates.

The following examples illustrate the fabrication of typical semiconductor devices:

*Example 4*

Figure 2:
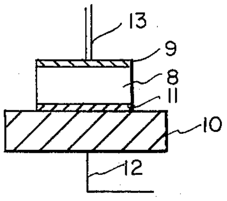
FIGURE 2 is a schematic diagram of a point contact rectifier having the epitaxial layer and substrate typical of this invention.

The construction of a point contact rectifier is shown in the present example. In FIGURE 2, 13 represents a point contact electrode of a conventional metal such as tungsten, molybdenum, Phosphor-bronze or platinum, which makes a rectifying contact with the epitaxial layer of the present device. Element 8 represents a semiconductor material of p-type silicon carbide as the substrate. The epitaxial film 9 of single crystal boron phosphide which may be of n- or p-type as discussed below is formed by vapor phase deposition. The boron phosphide so prepared is a thin layer, which is readily obtained at $10^{-5}$ cm. to 0.05 or preferably $5\times10^{-7}$ to 0.1 cm. These can be far thinner, e.g., to 0.1 as thin as can be obtained by mechanical sawing using conventional means. The semiconductor substrate 8 is in contact with a base metal 10 formed from a conventional metal such as copper or a similar material. This element 10 desirably has good thermal conductivity. In order to provide good electrical contact between the semiconductor 8 and the base metal 10, a conducting material such as a film of silver, 11, for example, may be employed as the soldering material to provide an ohmic contact of low resistance. The base metal 10 is provided with a lead 12 of copper, etc. of good electrical conductivity which represents the second contact.

The rectifier shown in FIGURE 2 is provided with an electrode 13 having a point contact whereby rectifying contact is made with epitaxial film 9 wherein a second p-n or n-p junction is formed in the device, i.e., one p-n or n-p junction between the substrate 8 and epitaxial layer 9 and the other between the point contact electrode 13 and epitaxial layer 9.

Another modification of the rectifier shown in FIGURE 2 is to provide a contact electrode 13 having a wide area of contact with film 9 in order to provide ohmic contact with low resistance. Good electrical contact is provided in this modification by soldering, brazing or welding using a good electrical conducting material such as a film of silver between the contact electrode and the epitaxial film. The rectifier can exist in a variety of forms convenient to the device user.

Figure 3:
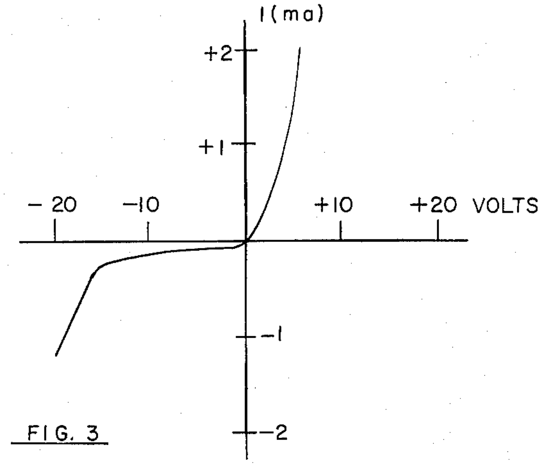
FIGURE 3 is a graph showing a plot of a current-voltage curve of the dynamic rectification properties for the rectifier shown in FIGURE 2.

FIGURE 3 shows a plot of the D.C. current-voltage characteristics of the rectifier shown in FIGURE 2 and indicates a rectification ratio of about 100 to 1 and a back voltage of about 20 volts without breakdown.

Multiple units of the present point contact rectifier may also be provided such as by making alternate connections between the base 10 and the corresponding lead 12 of the next unit.

In the formation of multiple units, it is an advantage of the present epitaxial boron phosphide that deposition of lightly-doped regions on the surface or within the structure can readily be attained. A number of alternating high resistivity n- and p-layers, each relatively thin, may be deposited at the external surface of the device (the product in conventional electronics terminology) to provide an isolation region between deposited layers. This has the advantage of reducing capacitive coupling between separate portions of the structure and also provides a high resistivity path since many back-biased diodes must be traversed to go from one region to another within a structure.

*Example 5*

The boron phosphide as an epitaxial layer is doped to form a p-n junction. A practical embodiment of such doped epitaxial boron phosphide is as a tunnel diode.

Doping is easily controlled in the present semiconductor component, and unusually high orders of doping are easily possible, in the manufacture of tunnel diodes which require as much as 0.1% by weight of doping. The carrier concentrations are of the order of $5\times10^{19}$ to $2\times10^{20}$. The dopant is vaporized together with the boron phosphide to obtain unusually homogeneous distribution of the dopant in the epitaxial film. For example, p-type dopants such as zinc and cadmium as well as n-type dopants such as sulfur, selenium, or tellurium are vaporized in the appropriate concentration relative to the boron phosphide.

The distinguishing feature of the tunnel diode is the high concentration of the dopant as shown herein. In this example zinc is the p-type dopant present at a $8\times10^{19}$ carriers/cc. concentration in the epitaxial layer. This layer is produced by depositing the p-type boron phosphide upon a substrate of silicon carbide containing arsenic as the n-type dopant with $1\times10^{20}$ carriers/cc. concentration.

Figure 4:
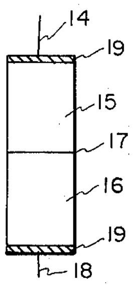
FIGURE 4 shows a tunnel diode having the epitaxial layer and substrate as the semiconductor component with the p-n junction between the layers.

In FIGURE 4 element 14 represents a lead of a conventional metal such as copper, which makes an ohmic contact with the present device. Element 15 of the present device represents zinc-doped epitaxial boron phosphide. The single crystal boron phosphide which is p-type as discussed above is formed by vapor phase deposition with the zinc dopant. The boron phosphide so prepared is a thin layer of about $10^{-6}$ cm. but in general is readily obtained at $10^{-5}$ cm. to 0.05 or preferably $5\times10^{-7}$ to 0.1 cm. thickness. These can be far thinner, e.g., to 0.1 as thin as can be obtained by mechanical sawing, using conventional means. The first epitaxial layer 15 is in contact with a silicon carbide substrate layer 16 but which has an opposite conductivity type dopant, e.g., antimony. The junction between the two layers is shown as 17. Element 16 has a lead 18 of a conventional metal such as copper or a similar material. These lead elements 14 and 18 desirably have good thermal conductivity. In order to provide good electrical contact between the semiconductor and the lead metal, a conducting substance such as a film of silver 19 for example, may be employed as the soldering material to provide an ohmic contact of low resistance. The present tunnel diode can exist in a variety of forms convenient to the device user. Thus, the example shown here is made as a cylinder of about .1 mm. diameter and .11 mm. thickness. This small size is a great advantage since it makes possible a switching time of $\sim10^{-12}$ sec. Sizes up to 1 mm. are also readily attained.

Multiple units of the present point contact rectifier may also be provided such as by making alternate connections between the base and the corresponding lead of the next unit.

In the formation of multiple units, it is an advantage of the present epitaxial boron phosphide that deposition of lightly-doped regions on the surface or within the structure can readily be attained. A number of alternating high resistivity n- and p-layers, each relatively thin may be deposited at the external surface of the device (the product in conventional electronics terminology) to provide an isolation region between deposited layers. This has the advantage of reducing capacitive coupling between separate portions of the structure and also provides a high resistivity path since many back-biased diodes must be traversed to go from one region to another within a structure.

*Example 6*

Figure 5:
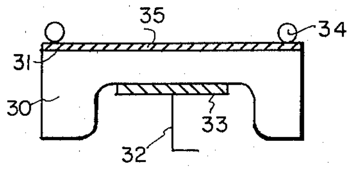
FIGURE 5 shows a photocell having the epitaxial film on the substrate.

As an example of the medium doped epitaxial boron phosphide, the present example shows a photovoltaic cell. This device, which is schematically shown in FIGURE 5 is composed of a major body 30 of n-type silicon carbide which has a thin layer 31 of p-type boron phosphide deposited upon the n-type portion as described above. In order to make electrical contact with the n-type material, a lead 32 is attached to 30 by means of a soldered joint, such as silver solder or silver paint 33 joining lead 32 to body 30.

In the present device the p-n junction should be just below the light receptive surface. All other surfaces should be protected during deposition, provided with a counter layer, or be lapped, cut or etched to eliminate the epitaxial layer from all but the light receptive surface. A contact is then made with the n-type body. The second electrical contact in addition to element 32 is made directly with the p-surface by a ring 34 at the top or side of the disc to provide contact with the external measuring circuit.

In the operation of the photovoltaic cell, which is also suitable for use as a solar cell, light is directed towards the free face corresponding of the p-type boron phosphide as an epitaxial layer with the result that an electric signal is obtained from leads 32 and 34.

It is desirable that the epitaxial layer 31 be as thin as possible, for example $10^{-5}$ cm. in order to permit weak light beams to be detected, or in general, less than $4\times10^{-4}$ cm.

In a modification especially suitable for a solar cell the parent layer, element 30, is n-type (phosphorus doped) silicon carbide containing $1\times10^{17}$ carriers/cc. The p-n junction is formed using vapor deposition of p-type boron phosphide (zinc doped, about $10^{18}$ carriers/cc.) and with this external layer 31 being about $2\times10^{-4}$ cm. in depth. In general for a solar cell, this layer is made $1\times10^{-4}$ to $2\times10^{-4}$ cm. In the present device the surface area of the cell is 0.001 cm.$^2$, but the method is applicable equally well to large areas. In devices of the type described in this example conversion efficiencies of about 5% are obtained which surpasses efficiencies of about 2% for cadmium telluride presently used in solar cells.

The present photovoltaic cells prepared by vapor deposition of an epitaxial layer are easily made as a part of other apparatus, which cannot be made by conventional diffusion or alloying. For example, a transistor in a micromodule is powered from the output of the photovoltaic (e.g., solar type) cell, making an external power source unnecessary, so that the combination unit can be isolated particularly to avoid short circuiting p and n layers in a transistor.

In using the epitaxial boron phosphide as a light and radiant energy detection and measurement material, it is a particular advantage of this material that it has an unusually high energy gap, e.g., 5.8 e.v., so that intense energy radiation, such as $\beta$-radiation encountered in space can readily be detected.

*Example 7*

Figure 6:
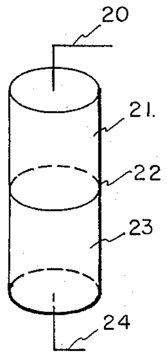
FIGURE 6 shows a rectifier similar to the tunnel diode of FIGURE 4.

The present example illustrates the manufacture of rectifiers, using boron phosphide as an epitaxial layer doped to form an n-type substitute with sulfur as the dopant ($1\times10^{15}$ carriers/cc.). Reference is made in this example to FIG. 6.

The silicon carbide base layer 23, is of p-type (boron dopant with a greater concentration than $1\times10^{15}$). The thickness is 0.001 cm. for the n-layer, the total thickness being 0.01 cm.

Doping is easily controlled in the present device. The carrier concentrations in general are of the order of $1\times10^{13}$ to $1\times10^{17}$. The dopant is vaporized together with boron phosphide to obtain unusually homogeneous distribution of the dopant in the epitaxial film. For example, p-type dopants such as zinc and cadmium as well as n-type dopants, such as tin, sulfur, selenium or tellurium, are vaporized in the appropriate concentration relative to the boron phosphide.

In FIGURE 6, which is applicable to rectifiers, element 20 represents a lead of a conventional metal such as copper, which makes an ohmic contact with the present device. Element 21 of the present device represents sulfur-doped epitaxial boron phosphide. The single crystal boron phosphide which is n-type as discussed above is formed by vapor phase deposition with the sulfur dopant. The boron phosphide so prepared is a thin layer, the overall diameter being about 0.30 cm. The junction between the two layers is shown as element 22. Element 23 has a lead 24 of a conventional metal such as copper or a similar material. These lead elements 20 and 24 desirably have good thermal conductivity. In order to provide good electrical contact between the semiconductor and the lead metal, a conducting surface such as silver, for example, may be employed as the soldering material to provide an ohmic contact of low resistance. The present rectifiers can exist in a variety of forms convenient to the device user. Thus, the example shown here is made as a cylinder.

The electrical characteristics of the rectifier are controlled by (1) the resistivity of the base material, (2) the sharpness of the junction with respect to the diffusion of the p- and n-type dopants into the other zone, and (3) the width of the base layer.

Figure 8:
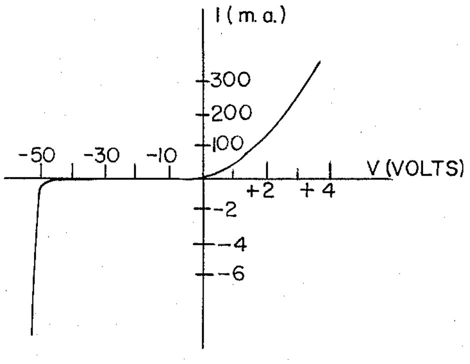
FIGURE 8 is a graph showing a typical D.C. current-voltage plot of a diode having the epitaxial film and substrate structure and exhibiting Zener characteristics.

It is found that for a layer of n-type material as described above and a very sharp junction of discontinuity a sharp reverse breakdown at 50 volts is obtained with a current of 5 ma. as shown in FIGURE 8. This is what is known as a Zener diode.

Figure 7:
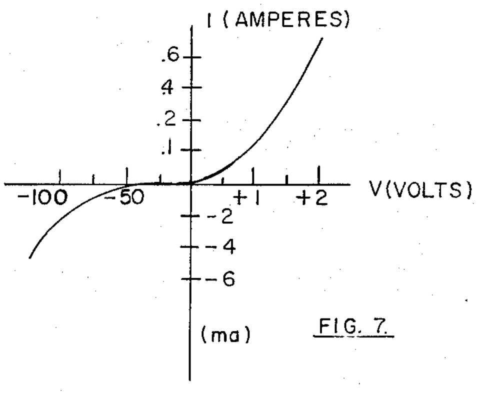
FIGURE 7 is a graph showing a plot of the D.C. current-voltage characteristics of a graded p-n junction rectifier having the structural characteristics defined herein.

When a graded or more diffuse junction is used, the V–I characteristics are likewise more gradual as shown in FIGURE 7. Here a reverse voltage of 100 v. is obtained with a leakage current of 1 ma. In the forward direction a voltage drop of 2 v. is obtained with ½ amp.

While the present description has provided illustrative embodiments, the invention is not to be construed as limited thereto, and that various modifications will occur to those skilled in the art without departing from the spirit and scope of the present invention.

I claim:

1. As an article of manufacture a substrate material consisting essentially of silicon carbide and at least one epitaxial layer consisting essentially of boron phosphide.

2. Article according to claim 1 wherein said epitaxial layer and said substrate each contain a small amount of a doping element to provide junctions between the layers which have different conductivity type.

3. Article according to claim 2 wherein said doping element in said epitaxial layer is selected from the group consisting of beryllium, magnesium, zinc, cadmium and mercury to produce p-type conductivity and said doping element in said substrate is selected from the group consisting of phosphorus, arsenic, antimony and bismuth to produce n-type conductivity.

4. Article according to claim 2 wherein said doping element in said epitaxial layer is selected from the group consisting of tin, sulfur, selenium and tellurium to produce n-type conductivity, and said doping element in said substrate is selected from the group consisting of boron, aluminum, gallium and indium to produce p-type conductivity.

5. As an article of manufacture a substrate material consisting essentially of silicon carbide and a plurality of epitaxial layers of boron phosphide, each layer being epitaxially connected to adjacent layers and having different electrical conductivity type.

6. Semiconductor devices having as the semiconducting component thereof a substrate material consisting essentially of silicon carbide having at least one epitaxial layer consisting essentially of single crystal boron phosphide, said silicon carbide and said epitaxial layer(s) having different electrical conductivity type to provide at least one p-n junction therebetween, at least one high melting point conductor attached to said semiconducting component and making ohmic contact therewith, and at least one electrode attached to said epitaxial layer(s) and making electrical contact therewith.

7. A semiconductor device having at least one epitaxial layer consisting essentially of boron phosphide and a substrate of another semiconductor consisting essentially of silicon carbide in contact with the boron phosphide, and external leads thereto.

8. A rectifier having an epitaxial layer consisting essentially of boron phosphide of one conductive type, and a substrate layer consisting essentially of semiconductive silicon carbide of another conductive type in contact therewith and electrical leads in respective contact with the two layers.

9. A point contact rectifier having a base semiconductor material consisting essentially of silicon carbide having an ohmic contact therewith, an epitaxial layer consisting essentially of boron phosphide, and having a metal lead in contact with the said boron phosphide.

10. A tunnel diode having an epitaxial layer consisting essentially of boron phosphide of one conductive type, and in contact therewith, a substrate layer consisting essentially of silicon carbide of the opposite type of conductivity and external leads to the two said layers.

11. A photovoltaic cell having a light receptive surface layer consisting essentially of p-type epitaxial boron phosphide and in contact therewith a base layer consisting essentially of silicon carbide of n-type conductivity and electrical leads in contact with the respective layers.

References Cited by the Examiner

UNITED STATES PATENTS

| | | | |
|---|---|---|---|
| 2,692,839 | 10/54 | Christensen et al. | 148—1.5 |
| 2,798,989 | 7/57 | Welker | 148—1.5 X |
| 2,846,340 | 8/58 | Jenny | 148—1.5 |
| 2,898,248 | 8/59 | Silvey | 148—1.5 |
| 2,918,396 | 12/59 | Hall | 148—1.5 |
| 3,011,877 | 12/61 | Schweickert et al. | 148—1.5 X |
| 3,014,820 | 12/61 | Marinace et al. | 148—1.5 |
| 3,030,189 | 4/62 | Schweickert et al. | 148—1.5 X |
| 3,073,679 | 1/63 | Stone et al. | 23—204 |
| 3,094,387 | 6/63 | Williams | 23—204 |

FOREIGN PATENTS

| | | |
|---|---|---|
| 1,184,921 | 2/59 | France. |
| 1,193,194 | 4/59 | France. |

OTHER REFERENCES

IBM Journal of Research and Development, vol. 4, No. 3, pages 283–287, July 1960.

IBM Journal of Research and Development, vol. 4, No. 3, pages 280–283, July 1960.

Marinace: Article in the IBM Techanical Disclosure Bulletin, vol. 3, No. 8, January 1961, page 33.

DAVID L. RECK, *Primary Examiner.*

RAY K. WINDHAM, *Examiner.*